United States Patent
Hsu et al.

(10) Patent No.: US 12,013,643 B2
(45) Date of Patent: Jun. 18, 2024

(54) METHOD OF CUTTING CONDUCTIVE PATTERNS

(71) Applicant: Taiwan Semiconductor Manufacturing Co., Ltd., Hsin-Chu (TW)

(72) Inventors: Chin-Hsiung Hsu, Guyanyin Township (TW); Huang-Yu Chen, Zhudong Township, Hsinchu County (TW); Tsong-Hua Ou, Taipei (TW); Wen-Hao Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/883,576

(22) Filed: Aug. 8, 2022

(65) Prior Publication Data
US 2022/0382160 A1    Dec. 1, 2022

Related U.S. Application Data

(60) Continuation of application No. 16/683,150, filed on Nov. 13, 2019, now Pat. No. 11,429,028, which is a
(Continued)

(51) Int. Cl.
*H05K 3/00*      (2006.01)
*G03F 1/70*      (2012.01)
(Continued)

(52) U.S. Cl.
CPC .............. *G03F 7/2022* (2013.01); *G03F 1/70* (2013.01); *G06F 30/39* (2020.01); *H01L 21/3213* (2013.01); *H05K 3/0082* (2013.01); *H05K 3/06* (2013.01); *H05K 3/0005* (2013.01); *H05K 3/068* (2013.01); *H05K 2201/09781* (2013.01); *H05K 2203/0557* (2013.01); *H05K 2203/1476* (2013.01); *Y10T 29/49156* (2015.01)

(58) Field of Classification Search
CPC ....... G03F 7/2022; G03F 1/70; H05K 3/0082; H05K 3/06; H05K 3/0005; H05K 3/068; H05K 2201/09781; Y10T 29/49156
See application file for complete search history.

(56) References Cited

U.S. PATENT DOCUMENTS 3,547,724 A * 12/1970 Zagusta .................. H05K 3/041
                                                        156/253
3,913,219 A     10/1975 Lichtblau
(Continued)

OTHER PUBLICATIONS

Ghaida, R. et al., "Single-Mask Double-Patterning Lithography", Proc. of SPIE, 2009, 7488:74882J-1-J-11.

*Primary Examiner* — Donghai D Nguyen
(74) *Attorney, Agent, or Firm* — Duane Morris LLP

(57) ABSTRACT

A method includes: providing a first layout of a first layer over a substrate, the first layer having at least one metal pattern, and generating a second layout by placing a cut mask at a first position relative to the substrate to remove material from a first region of the at least one metal pattern to provide a first metal pattern and placing the cut mask at a second position relative to the first layer over the substrate to remove material from a second region of the at least one metal pattern to provide a second metal pattern.

20 Claims, 13 Drawing Sheets

Related U.S. Application Data continuation of application No. 15/189,311, filed on Jun. 22, 2016, now Pat. No. 10,509,322, which is a division of application No. 13/924,681, filed on Jun. 24, 2013, now Pat. No. 9,380,709.

(60) Provisional application No. 61/787,456, filed on Mar. 15, 2013.

(51) Int. Cl.
*G03F 7/20* (2006.01)
*G06F 30/39* (2020.01)
*H01L 21/3213* (2006.01)
*H05K 3/06* (2006.01)

(56) References Cited

U.S. PATENT DOCUMENTS

| | | | |
|---|---|---|---|
| 4,894,316 A | 1/1990 | Hjulstrom | |
| 5,496,777 A | 3/1996 | Moriyama | |
| 5,753,391 A | 5/1998 | Stone | |
| 6,060,330 A | 5/2000 | Huggins | |
| 6,423,455 B1 | 7/2002 | Tzu | |
| 6,534,743 B2 | 3/2003 | Swenson | |
| 6,662,429 B1 | 12/2003 | Domorazek | |
| 6,724,096 B2 | 4/2004 | Werner | |
| 6,940,147 B2 | 9/2005 | Crawford | |
| 7,700,944 B2 | 4/2010 | Nishizawa | |
| 7,714,417 B2 * | 5/2010 | Nonoyama | H05K 3/305 257/669 |
| 7,820,363 B2 | 10/2010 | Sekimoto | |
| 7,930,822 B2 | 4/2011 | Nakanishi | |
| 8,338,192 B2 | 12/2012 | Le Neel | |
| 8,850,369 B2 | 9/2014 | Lung | |
| 8,959,761 B2 | 2/2015 | Jung | |
| 9,380,709 B2 | 6/2016 | Hsu | |
| 2002/0052122 A1 | 5/2002 | Tanaka | |
| 2004/0118824 A1 | 6/2004 | Burgess | |
| 2004/0209439 A1 | 10/2004 | Haba | |
| 2008/0158650 A1 | 7/2008 | Lee | |
| 2008/0257488 A1 | 10/2008 | Yamano | |
| 2009/0288869 A1 | 11/2009 | Anderson | |
| 2010/0224391 A1 | 9/2010 | Tamura | |
| 2012/0200200 A1 | 8/2012 | Jung | |

* cited by examiner

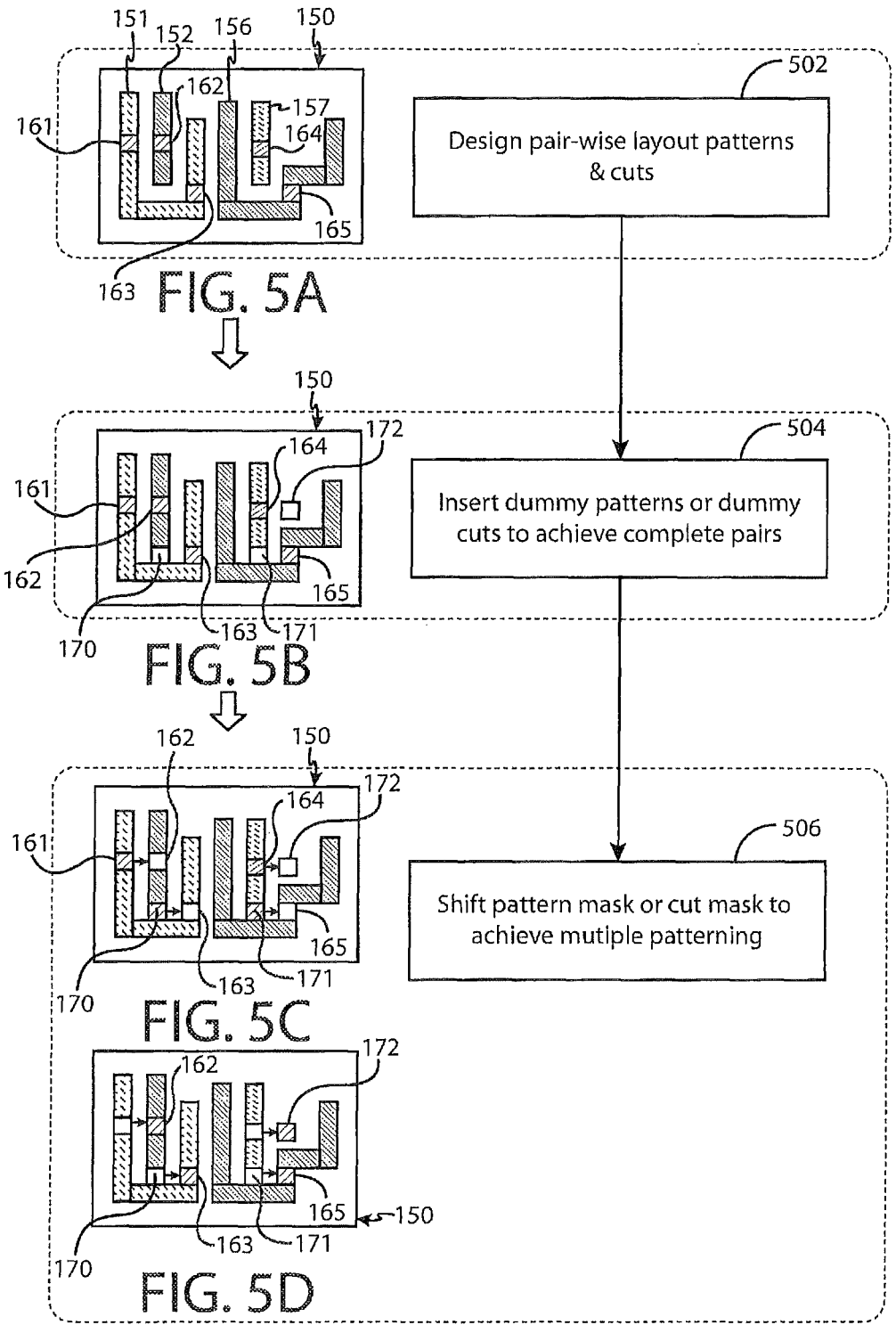

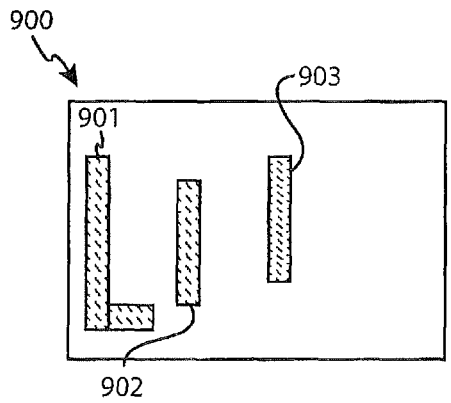 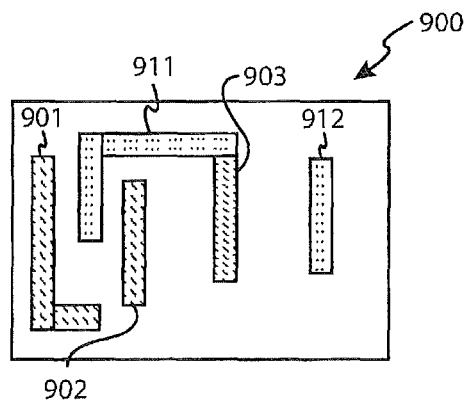
FIG. 9A　　　　　FIG. 9B
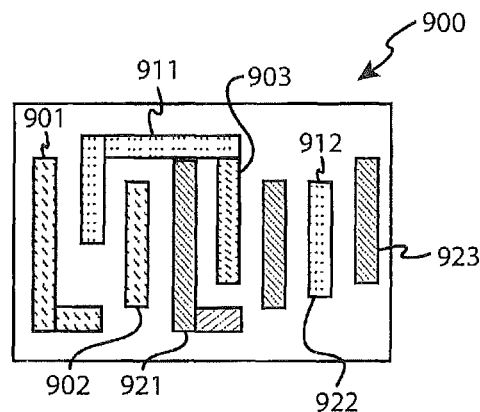
FIG. 9C
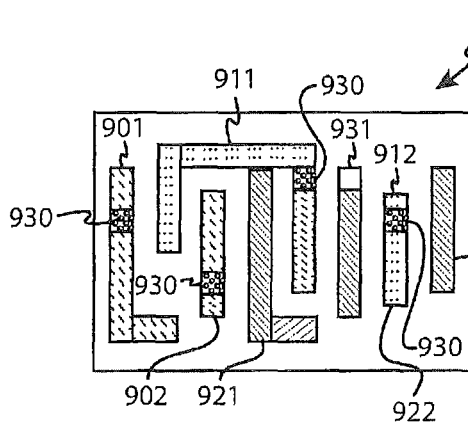 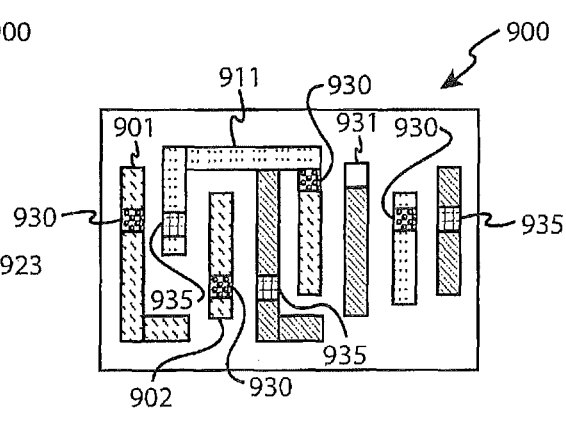
FIG. 9D　　　　　FIG. 9E

METHOD OF CUTTING CONDUCTIVE PATTERNS

This application is a continuation of U.S. patent application Ser. No. 16/683,150, filed Nov. 13, 2019, which is a continuation application of U.S. patent application Ser. No. 15/189,311, filed Jun. 22, 2016, now U.S. Pat. No. 10,509,322, which is a division of U.S. patent application Ser. No. 13/924,681, filed Jun. 24, 2013, now U.S. Pat. No. 9,380,709, which claims the benefit of U.S. Provisional Patent Application No. 61/787,456, filed Mar. 15, 2013, each of which are incorporated by reference herein in their entireties.

FIELD

This disclosure relates to semiconductor fabrication generally, and more specifically to electronic design automation tools.

BACKGROUND

In semiconductor integrated circuit (IC) fabrication processes, the resolution of a photoresist pattern begins to blur at about 45 nanometer (nm) half pitch. To continue to use fabrication equipment purchased for larger technology nodes, multi-exposure methods have been developed.

Multiple exposure or multi-patterning technology (MPT) involves forming patterns on a single layer over a substrate using two or more different masks in succession. As long as the patterns within each individual mask comply with the relevant minimum separation distances for the technology node, the combination of patterns formed using the plural masks may include smaller spacings than the minimum separation distance. MPT allows line segments, and in some cases, vertices (angles) to be formed of a vertical segment and a horizontal segment on the same mask. Thus, MPT provides flexibility and generally allows for significant reduction in overall IC layout.

MPT is a layout splitting method analogous to an M-coloring problem for layout splitting in graph theory, where M is the number of masks used to expose a single layer (and the number of exposures). For example, if two masks are to be used (double patterning technology, DPT), it is customary to refer to the patterns as being assigned one of two "color types", where the color corresponds to a photomask assignment. As used herein, DPT is an example of MPT, so that generic references to MPT include DPT as one non-limiting example.

If every possible combination of mask assignments violates the minimum spacing rule in either or both of the masks used for DPT, then the layout has a "native conflict", DPT alone does not avoid the native conflict.

BRIEF DESCRIPTION OF THE DRAWINGS

FIGS. 5A-5D show a method for patterning including shifting a cut mask.

FIGS. 9A-9E show an example in which triple patterning technology (TPT) is performed using two photomasks, in which at least one mask is shifted

DETAILED DESCRIPTION

Figures 1A, 1B:
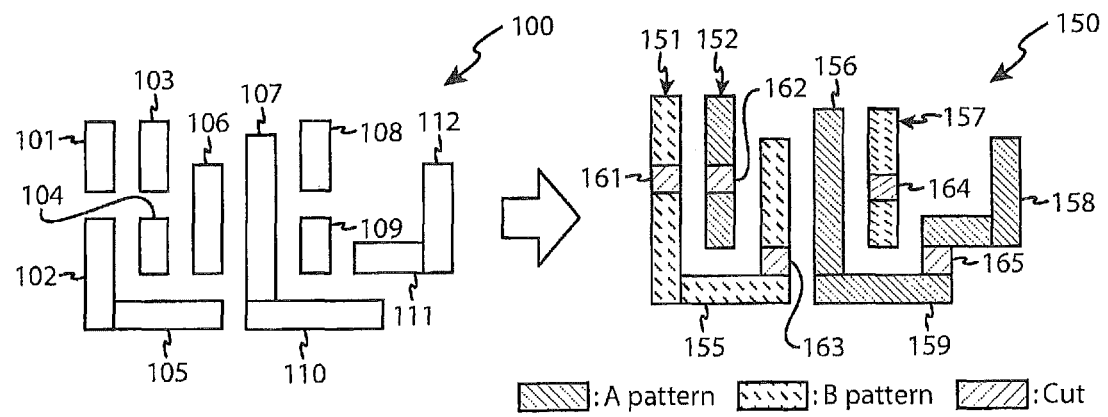
FIGS. 1A and 1B show a metal cut method to resolve a native conflict.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1A is a diagram of a target layout 100 of a layer of an IC. The layout 100 includes a plurality of polygons 101-112, each representing a conductive pattern of a conductive line layer (also referred to as "metal line layers" or "metal layers").

Each pair of patterns 101-112 is separated from each other by a respective spacing. At each technology node (e.g., 65 nm, 40 nm, 28 nm, or the like), design rules establish a minimum separation distance between adjacent patterns to be clearly formed with a single exposure using a single photomask ("mask"). This, in the example of FIG. 1A, patterns 101-104 are closer than the minimum separation distance.

Further, the various pairs of patterns 101-104 are too close to all be patterned by DPT with two photomasks. For example, if patterns 101 and 102 are patterned by the first mask and patterns 103 and 104 are patterned by the second mask, the distance between patterns 101 and 102 is still smaller than the minimum separation distance. Likewise, if patterns 101 and 103 are patterned by the first mask and patterns 102 and 104 are patterned by the second mask, the distance between patterns 101 and 103 is still smaller than the minimum separation distance. This layout 100 has a "native conflict".

FIG. 1B shows how a metal cut process can resolve the native conflict. The layout 100 is first modified to join patterns 101, 102 and 106 to form pattern 151, join patterns 103 and 104 to form pattern 152, join patterns 108 and 109 to form pattern 157, and join patterns 107 and 112 to form pattern 156. These patterns can now be assigned to two masks for double patterning, and comply with the DPT design rules. A double-exposure method is performed on the layout 150 of a layer on the semiconductor substrate using two photomasks. The double exposure method can be double-exposure, double etch, for example. The patterns 151 and 157 are patterned using a first photomask, and the patterns 152 and 156 are patterned using a second photomask. The layout of the layer on the substrate has now been patterned.

At least one cut mask is then used to perform a metal cut process. The cut mask has the patterns 161-165 corresponding to the regions which were added to the target layout 100 to join patterns separated by less than the minimum separation distance (for single exposure lithography). These patterns 161-165 are now removed (by photolithography) from respective regions of the patterns 151, 152, 156 and 157. Following removal of conductive material from the regions of cut patterns 161-165, pattern 151 is divided into patterns 101, 102 and 106, pattern 152 is divided into patterns 103-104, pattern 156 is divided into patterns 107 and 112, and pattern 157 is divided into patterns 108 and 109. The target layout 100 has now been patterned onto the layer on the substrate, using the combination of DPT and metal cuts.

When the distance between the cut patterns 161 and 162 is less than the minimum cut separation distance, a single cut mask does not clearly remove the regions 161-165. One optional method for addressing this is to use two cut masks for the same layer, and double pattern the metal cuts. Embodiments are described herein to reduce mask cost by designing complete-paired patterns or cuts and reusing a single pattern or cut mask for exposing the same layer of an IC. That is, a single pattern mask or a single cut mask is used at least twice (in two different positions relative to the substrate) to expose a resist for forming a single layer of the IC.

Figures 2A, 2B:
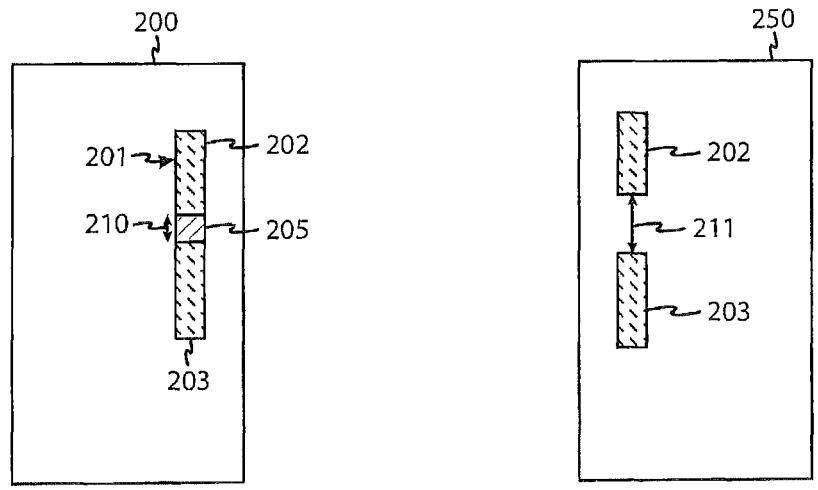
FIGS. 2A and 2B show a spacing provided by a metal cut method, and a minimum separation using a single exposure, single mask method, respectively.

FIG. 2A shows spacing achievable using a metal cut process. A target layout 200 has patterns 202 and 203. By joining together patterns 202 and 203 to form a single pattern 201, they can both be formed on the substrate by a single photomask using one exposure. Subsequently, in a metal cut process, the material is removed from region 205, to divide the single pattern 201 into two patterns 202, 203. The distance between patterns 202 and 203 is the length 210 of the cut region of the cut mask. FIG. 2B, on the other hand, shows the spacing achievable by a single exposure and single mask, without the metal cut process. The layout 205 has the same two patterns 202 and 203 shown in FIG. 2A, but the spacing 211 between the patterns 202 and 203 is greater than the spacing 210 of FIG. 2A.

Figure 3A:
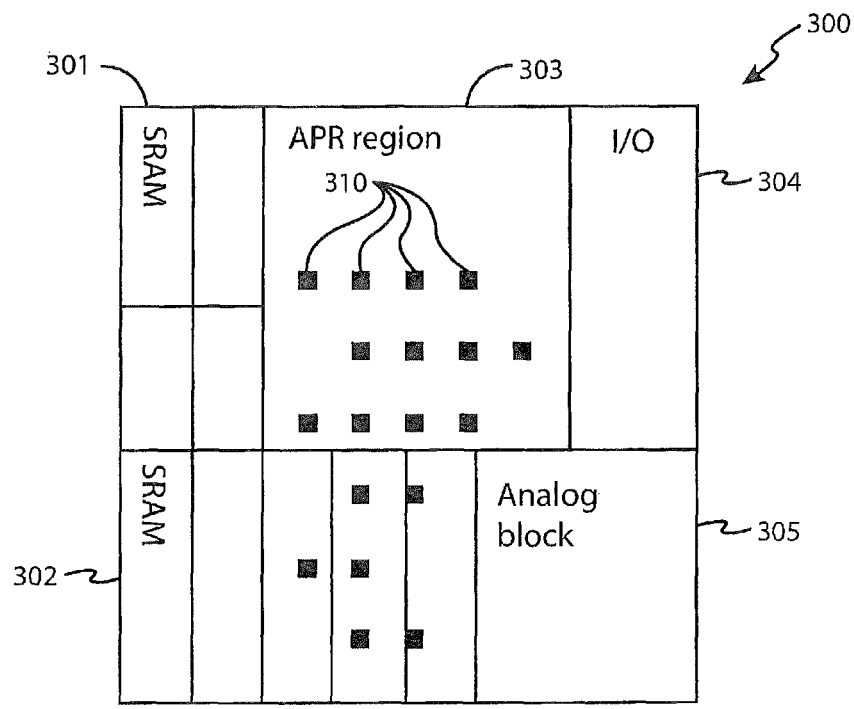
FIG. 3A shows a plan view of an IC with a plurality of metal cut regions.
Figure 3B:
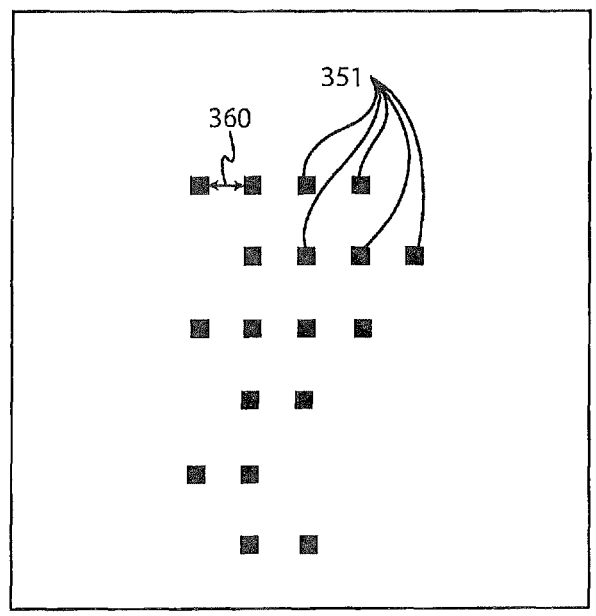
FIG. 3B shows a metal cut mask layout for the metal cut regions of FIG. 3A.

FIG. 3A shows an example of an IC 300. The IC has various functions and regions, including SRAM 301 and 302, an I/O block 304, an analog block 305, and an automatic place and route (APR) region 303 containing the conductive routing lines of the interconnect layers. A plurality of metal cut regions 310 are shown within the APR region 303; metal cuts are not restricted to APR regions and can show in other regions, such as SRAMs. FIG. 3B shows a cut mask 350 with cut patterns 351 for patterning the metal cuts of FIG. 3B. If the IC 300 is patterned using DPT, then the spacing 360 between adjacent cut patterns 360 is likely to be smaller than the minimum separation distance for clearly exposing photoresist in the cut pattern regions. In other words, when the conductive line patters are formed by DPT, to permit the lines to be closer to each other than the minimum separation distance, there is a likelihood that metal cut regions for removing material from the conductive line patterns can also be closer to each other than the minimum separation distance. In such a situation, plural cut masks can be used to remove material from patterns in the same layer of the IC.

Figure 4A:
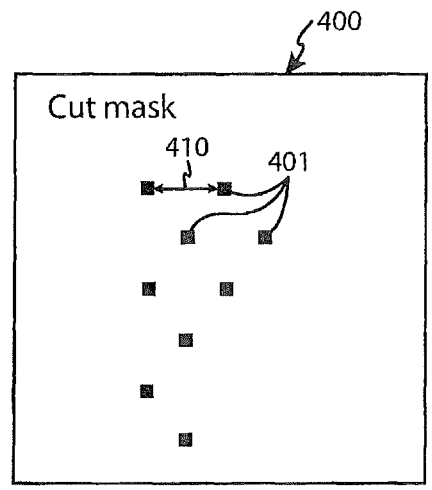
FIG. 4A shows a cut mask for implementing the metal cut regions of FIG. 3A, in a first position.
Figure 4B:
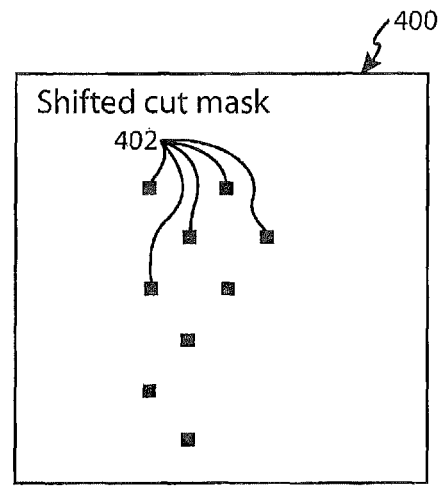
FIG. 4B shows the layout of metal cut regions of FIG. 3A, shifted by a common translation to a second position.
Figure 4C:
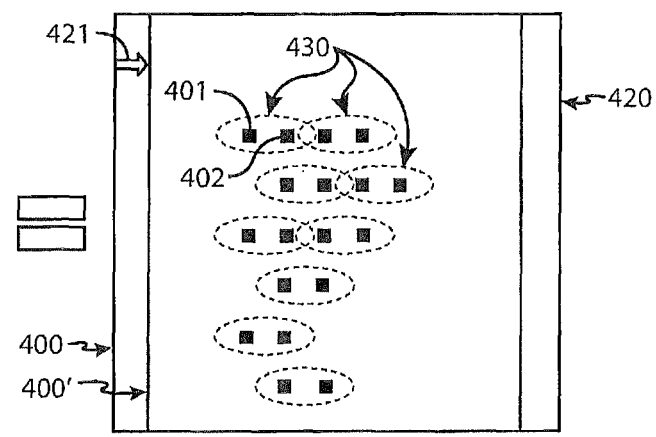
FIG. 4C shows the union of metal cut regions patterned by the cut mask of FIG. 4A in the first position shown in FIG. 4A and the second position shown in FIG. 4B.

The example of FIGS. 4A-4C reduces cut mask costs by shifting the cut mask and reusing the cut mask on the same layer, so that there is no need to make multiple cut masks for performing cut multiple patterning. This reduces cut mask costs in multiple patterning (e.g., DPT) by shifting one cut mask for patterning on the same layer. Thus, two or more sets of conductive patterns formed by multipatterning (MPT) using two or more masks can be subject to a metal cut process using the same cut mask for removing material from each set of conductive patterns. There is no need to have a respective cut mask corresponding to every pattern mask. This technique enhances cut flexibility.

FIG. 4A shows a cut mask 400 having a plurality of cut patterns 401. The separation 410 between adjacent cut patterns 401 is at least the minimum separation distance clear patterning using a single exposure and single mask. Compared to the cut mask 350 of FIG. 3B, the mask 400 of FIG. 4A has one half as many cut patterns. FIG. 4B shows the same cut mask 400' shifted to a different position relative to the substrate 300. The cut patterns 402 are used to remove material from different regions of the substrate 300. (In some embodiments, the cut mask 400 is shifted; in other embodiments, the cut mask 400 remains still, and the substrate is shifted). The cut mask 400' can now remove material from different locations in the substrate.

FIG. 4C shows a superposition 420 of the union of the set of cut patterns from the cut mask 400 located in the first position and the same cut mask 400' located in the second position. The cut patterns are formed in pairs 430. Each pair 430 has a first region patterned by a cut pattern 401 while the cut mask is in a first position, and a second region 402 patterned by the same cut pattern 401 while the cut mask 400 is in the second position (shifted relative to the first position). Each pair 430 has a common translation between the location of the first cut pattern 401 and the location of the second cut pattern 402.

In some embodiments, the pattern exposure/etch and metal removals with cuts are not interleaved. For example, for a double patterning method with double cut patterning, the process can be "1st metal patterning=>2nd metal patterning=>1st cut patterning=>2nd cut patterning." Using this sequence, cuts on the first cut mask can remove metal materials on both the first and second pattern masks. In other words, cuts on the first cut mask are not restricted to remove metal materials on the first pattern mask.

In other embodiments, the sequence is: "1st cut patterning=>2nd cut patterning=>1st metal patterning=>2nd metal patterning." In the physical fabrication technology, the metal shapes are really formed during the etching step, and etching is performed after patterning. Metal patterning and cut patterning are performed on the photoresist, which controls metal forming. Once the cut patterning is performed (before metal patterning), there is a material on the photoresist corresponding to those cut regions, and the material makes metal patterning inactive for those cut regions. Thus, no real metal shape is formed for those cut regions (where the first and second cut patterning steps are performed before the first metal patterning step).

In other embodiments, the pattern exposure/etch and metal removals with cuts can be interleaved. An example of such a sequence is 1st metal patterning=>1st cut patterning=>2nd metal patterning=>2nd cut patterning". In this sequence, the second cut patterning can remove material formed using the first pattern mask as well as material formed using the second pattern mask.

FIGS. 5A-5D show method for patterning with cut mask shift.

In FIG. 5A, step 502, the layout is designed with pairwise layout patterns and cuts, where each cut removes material so as to divide a pattern into two patterns. The layout 150 of FIG. 1B is shown as an example. The layout 150 has patterns 151, 152, 156 and 157 as described above. The layout 150 also includes the regions 161-165 which were added to join the individual patterns 101-112 (of FIG. 1A) which have the native conflict.

From inspection of FIG. 5A, cut patterns 161 and 162 form a pair separated by a half pitch. The remaining patterns 163-165 are not in pairs.

In FIG. 5B, at step 504, dummy patterns and/or dummy cuts are inserted to achieve complete pairs. In this example, dummy cuts 170-172 are inserted. Each of the dummy cuts 170-172 has a common translation relative to a respective cut pattern 163-165, which is the same as the translation from cut pattern 161 to cut pattern 162. (This is the translation of the cut mask from the first cut mask position to the second cut mask position.

When dummy cuts are used, the conductive material is removed from a third region of the layer on the IC substrate using a second cut pattern (exposed while the cut mask is in the first position), but after shifting the cut mask, the second exposure does not use the second cut pattern to remove conductive material from the layer on the IC substrate (because there is no material to be removed, at the location of the dummy cut pattern).

Once the layout is completed, the same cut mask having the cut patterns 161-165 is used to perform two exposure steps. A photoresist is applied over the substrate having the patterns 151, 152, 156 and 157. In each exposure step, the cut mask is used to expose the resist in cut regions, for removing conductive material of the conductive line layer within those regions.

In FIG. 5C, the cut mask is first used to expose the regions 161, 164, 170, and 171 of the photoresist. In some embodiments, the cut process includes a first etch performed after the first exposure (and a second etch is performed after the second exposure). In other embodiments, a single etch is performed after the second exposure. The regions 170 and 171 perform dummy cuts, since there is no conductive line layer material at the location of these patterns. The dummy cuts allow reuse of the same cut mask for both cut steps.

In step 506 of FIG. 5C, the cut mask is shifted to achieve multiple patterning. In some embodiments, an additional step of shifting the pattern mask and performing an additional exposure with the pattern mask is performed, as described below.

In FIG. 5D, after shifting the cut mask, a second exposure is performed using the cut mask, to expose regions 162, 163, 165 and 172 of the photoresist. The patterning of region 172 is a dummy cut, since there is no underlying conductive line layer material at the location where the photoresist is exposed for region 172. Thus, a single cut mask can be used to perform "metal cuts" for removing conductive material from patterns, such that the smallest spacing between cut patterns is less than the minimum separation distance between patterns formed using a single exposure with a single photomask.

Figure 6A:
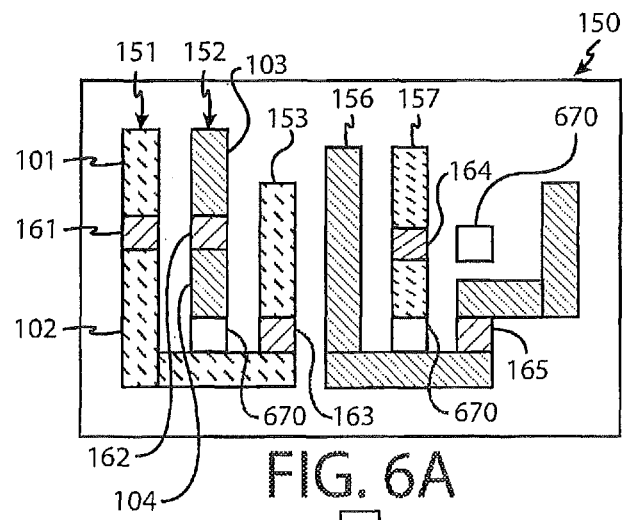
FIGS. 6A-6C show details of the metal cut process.
Figure 6B:
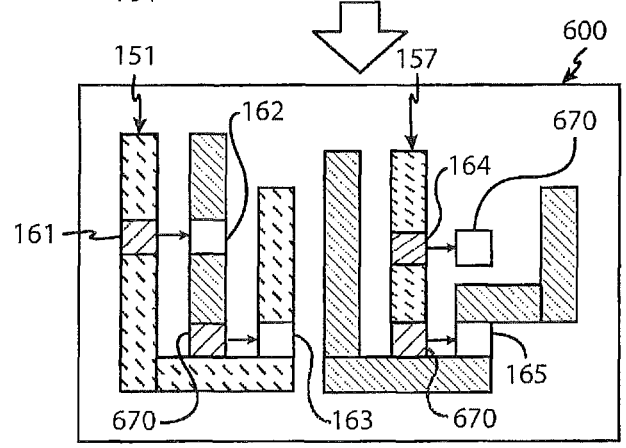
Figure 6C:
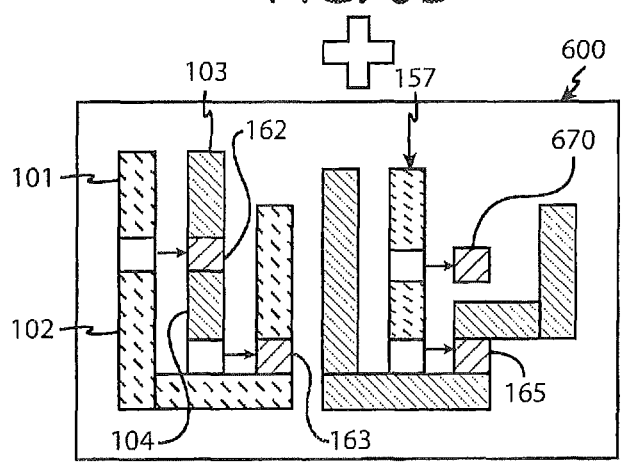

FIGS. 6A-6C show an example of the method.

FIG. 6A shows the layout 150 of FIG. 1B. The conductive patterns have been divided and assigned to two pattern photomasks. The patterns 151, 153, and 157 are assigned to a first mask, and the patterns 152, 156 are assigned to a second mask. The layer over the substrate is patterned with at least a first metal pattern 151. Then, the same layer over the substrate is patterned with a second photomask to form the second metal pattern. In this example, the entire set of patterns 150 of FIG. 1B are formed on the layer over the substrate. The cut patterns 161-165 are inserted to perform metal cuts to remove material to divide the metal patterns so as to achieve the target layout of FIG. 1A. Cut patterns 161 and 162 are spaced apart by ½ line spacing. Cut patterns 161 and 162 are too close together to be clearly patterned in a photoresist using a single exposure and a single cut masks. Thus, the layout lends itself to a ½ line common shift (translation). However, the cut patterns 163-165 do not have adjacent cut patterns for forming pairs of cut patterns. Thus, dummy patterns 670 are inserted adjacent to patterns 163-165. To determine where to insert dummy cut patterns 670, a determination is made whether there is an open space to the left or right of each pattern 163, 165. The dummy cut pattern 670 is added to the layout 150 in the location where the layer 150 of the layout has no conductive pattern. In this example, dummy cut patterns 670 are inserted to the left of cut patterns 163 and 165, and to the right of cut pattern 164.

Next, as shown in FIG. 6B, for providing a layout of the cut mask, the cut patterns on the same side in the first position of each pair (e.g., left or right, if a horizontal shift will be used, top or bottom if a vertical shift will be used). In FIG. 6B, the left cut pattern from each pair of cut patterns is selected to be included in the cut mask. This includes cut patterns 161 and 164, and dummy cut patterns 670 to the left of cut pattern regions 163 and 165.

The cut mask is used in a first position (e.g., left in FIG. 6B) relative to the substrate to perform a first cut patterning for removing material from a first region 161 and 164 within the respective first patterns 151 and 157. The cut patterns over dummy cut pattern regions 670 do not overlie conductive material while the cut mask is in the first position.

As shown in FIG. 6C, the same cut mask is then shifted and used to perform a second cut patterning while in a second position relative to the same layer over the substrate, for removing material from a second region 162, 163, 165 in a second metal pattern 152, 156 of the same layer over the substrate.

As a result of the cut process, the first metal pattern 151 is divided into a third metal pattern 101 and a fourth metal pattern 102, the third and fourth metal patterns 101, 102 being unconnected to each other.

A distance between the third and fourth metal patterns 101, 102 can be smaller than a desired minimum separation distance for patterns formed by a single exposure with a single mask.

Using the dummy cut pattern method shown in FIGS. 6A-6C, a cut mask having a first cut pattern and a second cut pattern can be used. With the cut mask in the first position, material is removed from a first region of the layer over the substrate using the first cut pattern, and material is removed from a third region of the layer over the substrate using the second cut pattern. Then, while the cut mask is in the second position the first cut pattern removes material, but the second cut pattern performs a "dummy cut" and does not remove metal material from the layer over the substrate.

In some embodiments, the two exposures of the photoresist using the cut mask are performed without performing an etching step therebetween. The sequence comprises: first exposure using the cut mask; shifting the cut mask; second exposure using the cut mask; and cut etching.

In other embodiments, the two exposures of the photoresist using the cut mask are separated by an etching step therebetween. The sequence comprises: first exposure using the cut mask; first cut etching; shifting the cut mask; second exposure using the cut mask; and second cut etching.

Figure 7A:
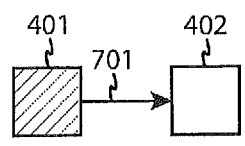
FIGS. 7A-7D show examples of common translations by which the cut mask can be translated.
Figure 7B:
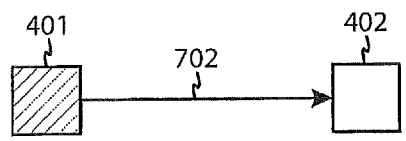
Figure 7C:
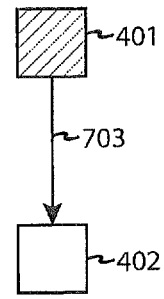
Figure 7D:
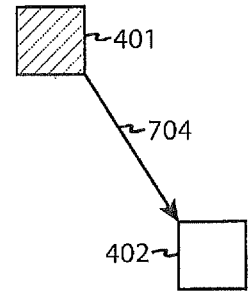

FIGS. 7A-7B show examples of different types of common translations (shifts) that can be applied to the cut mask between the first position and the second position. In FIG. 7A, the cut mask is shifted so that the cut pattern is applied to the region 401 in the first position, and translated by a short horizontal shift 701 (e.g., ½ line pitch in the horizontal direction) to the second position. In FIG. 7B, the cut mask is shifted so that the cut pattern is applied to the region 401 in the first position, and translated by a longer horizontal shift 702 (e.g., 1 full line pitch in the horizontal direction) to the second position. In FIG. 7C, the cut mask is shifted so that the cut pattern is applied to the region 401 in the first position, and translated by a short vertical shift 703 (e.g., ½ line pitch in the vertical direction) to the second position. In FIG. 7D, the cut mask is shifted so that the cut pattern is applied to the region 401 in the first position, and translated by a short diagonal shift 704 (e.g., ½ line pitch in the horizontal direction and ½ line pitch in the vertical direction) to the second position. These are only examples, and the shift of the cut mask can be any distance in the horizontal, vertical or diagonal direction.

FIGS. 8A-8D show a variation in which the cut mask is shifted, and the pattern mask is also shifted (or the substrate is shifted in an opposite direction relative to the pattern mask to achieve the same relative shift).

Figure 8A:
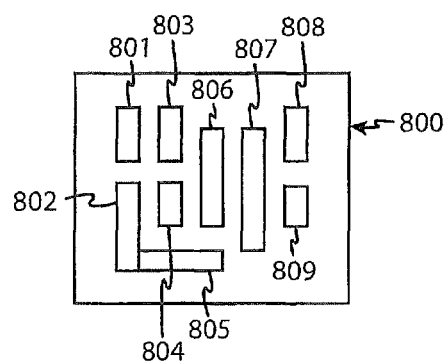
FIGS. 8A-8D show an example in which both the cut mask and pattern mask are shifted.

FIG. 8A shows a target pattern 800, including individual conductive line patterns 801-809. These patterns 801-809 have spacings that result in a native conflict for a normal DPT process.

Figure 8B:
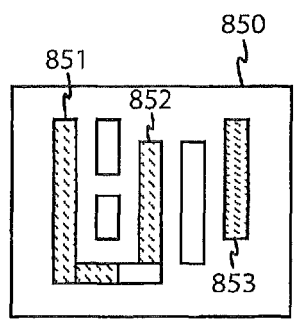
Figure 8C:
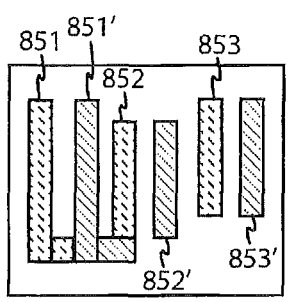

FIG. 8B shows a layer over a substrate patterned using a first pattern mask to form an "A" pattern 850, including the "L" pattern 851 and two line patterns 852 and 853. The unshaded patterns in FIG. 8B are included for reference only, and represent portions of the target pattern of FIG. 8A that have not yet been added to the layer of FIG. 8B.

A position of one of the substrate and the first pattern mask is then shifted relative to the other of the substrate and the first pattern mask. Then in FIG. 8C, the same layer over the substrate is patterned with the second metal pattern ("the shifted A pattern) using the same first pattern mask. The patterns deposited using the same mask after the shift are designated 851', 852', and 853'.

Figure 8D:
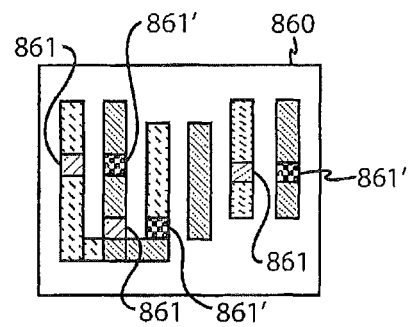

Finally, FIG. 8D shows the cut patterning for removing material from a plurality of first regions 861 in a first plurality of metal patterns 851-853, and for using the same cut mask to perform a second cut patterning for removing material from a plurality of second regions 861' in a plurality of metal patterns 851'-853' while in the second position relative to the same layer over the substrate. The resulting patterned layer is the target pattern of FIG. 8A. Thus, a smallest spacing between one of the first regions 801 and one of the second regions 803 is smaller than a spacing between ones of the plurality of cut patterns in the cut mask.

FIGS. 9A-9E show an embodiment of a triple patterning technology (TPT) method, including shifting of a pattern mask.

FIG. 9A shows a layer over an integrated circuit (IC) substrate patterned with a first photomask to form a first metal pattern 900, including the individual patterns 901-903.

FIG. 9B shows the same layer 900 of the substrate patterned with a second photomask to form a second metal pattern 911-912.

The first photomask is shifted relative to the first metal pattern 901-903; and the same layer 900 of the substrate is patterned with the first photomask after the shifting step to form a third metal pattern 921-923. The third metal pattern 921-923 is a provided by applying a common translation to the patterns 901-903. Thus, a first conductive pattern 901-903 is to be formed using a first pattern mask, and a second conductive pattern 921-923 is to be formed by shifting the first pattern mask relative to the first conductive pattern to a second location, and exposing the same layer over the IC substrate while the same first pattern mask is in the second location. The same layer over the IC substrate is patterned with a second photomask to form the second conductive pattern.

The method of FIGS. 9A-9C provides TPT using only two patterning photomasks without using a cut mask.

In other embodiments, TPT is performed as shown in FIGS. 9A-9B, with the addition of a cut mask. In some embodiments, the cut mask is used for one single cut patterning step on the layer on the substrate. In other embodiments, the cut mask is used for cut patterning, shifted and used for a second cut patterning step on the same layer on the substrate.

FIG. 9D shows the layer 900 of the substrate after applying a cut mask to remove conductive material from the regions 930. Because the height of the metal cut patterns is smaller than the minimum separation distance, the cut mask allows layouts which would otherwise have a native conflict.

In some embodiments, the cut mask is only applied once in a single cut process, as shown in FIG. 9D. In other embodiments, as show in FIG. 9E, the cut mask is shifted, to remove material from a second set of regions 935. The regions 935 are all offset from respective regions 930 by a common translation (shift).

Figure 10:
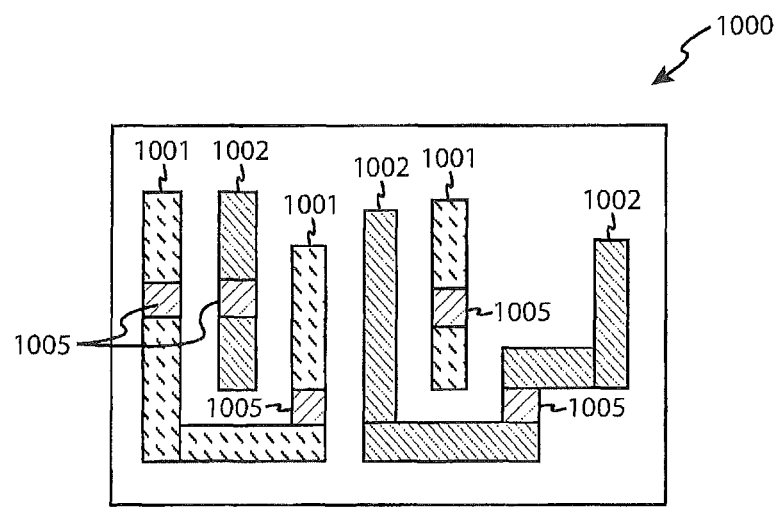
FIGS. 10 and 11 show a cut mask which can be shifted to implement a metal cut process, and a trim mask which can be substituted for the cut mask.
Figure 11:
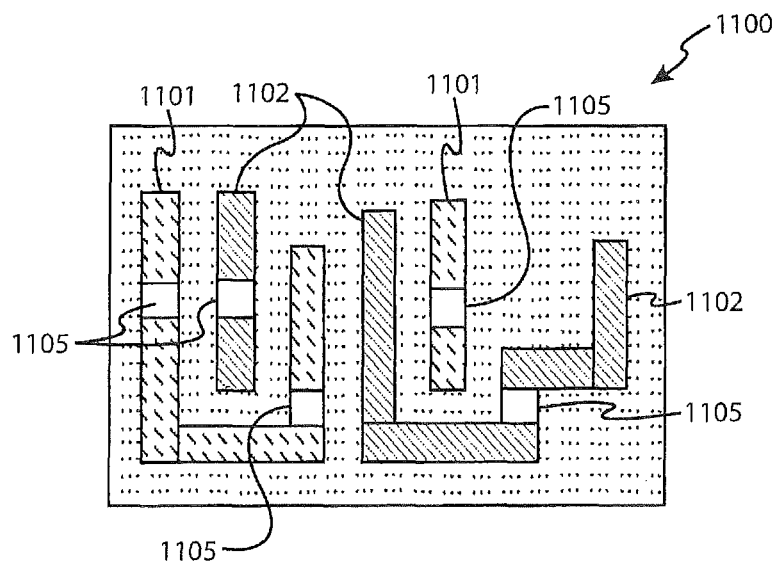

FIGS. 10 and 11 show that the method can be performed using a cut mask or a trim mask. A cut mask is used with a negative type resist, and a trim mask is used with a positive type resist. In the cut mask, the patterns 1005 overlie regions where conductive material is to be removed. The trim mask 1100 is essentially a negative of the cut mask 1000. In the trim mask, apertures 1105 overlie regions where conductive material is to be removed. Although patterns 1101-1102 are shown in FIG. 11 for ease of understanding, it is understood that they are covered by the trim mask 1100 and hidden from view.

In FIG. 10, the patterns 1001 and 1002 are formed by DPT, a negative photoresist is applied, the resist is exposed with the cut mask having the cut patterns overlying regions 1005, and material is removed by etching from the regions 1005. The negative photoresist is initially soluble. The cut mask is used to expose the photoresist outside the cut regions 1005. The unexposed regions of the photoresist (inside regions 1005) remain soluble for removal with a solvent, while the exposed regions 1005 are rendered insoluble.

FIG. 11 shows an equivalent trim mask. The resist is initially insoluble. The trim mask covers (and does not expose) the patterns 1101-1102, and is used to expose the resist inside of the trim regions 1105. The exposure renders the resist in regions 1105 soluble for removal with a solvent, while the resist in the trim regions 1101-1102 remains insoluble.

Figure 12:
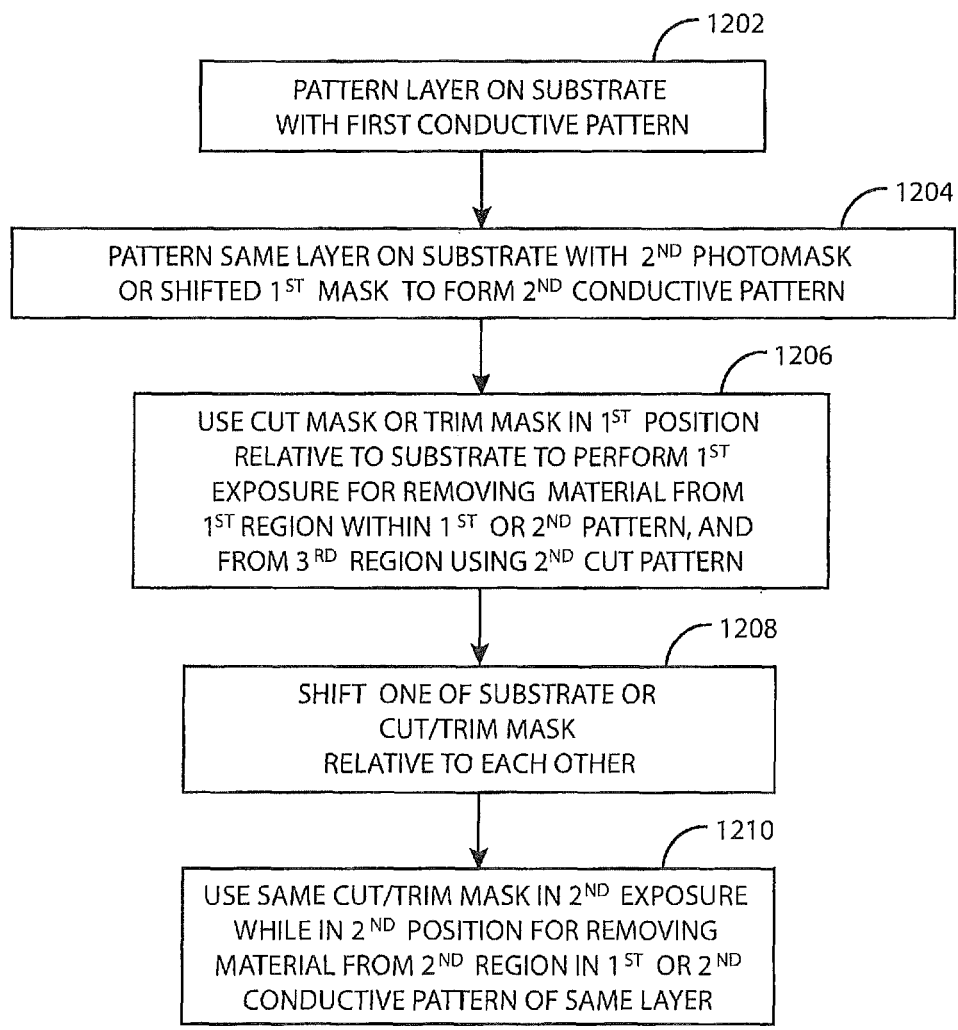
FIG. 12 is a flow chart of a method of patterning a substrate using multiple exposures with the same cut mask.

FIG. 12 is a flow chart of a method of multiple patterning according to some embodiments.

At step 1202, a layer on an integrated circuit (IC) substrate is patterned with a first conductive pattern.

At step 1204, the same layer on the substrate is patterned to form a second conductive pattern. In some embodiments, a position of either the IC substrate or the first pattern mask is shifted relative to the other of the IC substrate and the first pattern mask and the same layer on the IC substrate is patterned with the second conductive pattern using the first pattern mask. In other embodiments, a second mask is used to form the second conductive pattern without shifting the first or second pattern mask.

At step 1206, a cut mask or a trim mask is used in a first position relative to the IC substrate to perform a first exposure for removing material from a first region within the first pattern or second pattern, and from a third region using a second cut pattern. The cut mask or trim mask has a first cut pattern and a second cut pattern.

At step 1208, a position of one of the IC substrate and the one of the group consisting of the cut mask and the trim mask is shifted relative to the other of the IC substrate and the one of the group consisting of the cut mask and the trim mask before step 1210.

At step 1210, the same one of the group consisting of the cut mask and the trim mask is used in a second exposure while in a second position relative to the same layer over the IC substrate, for removing conductive material from a second region in a second conductive pattern of the same layer over the IC substrate.

Figure 13:
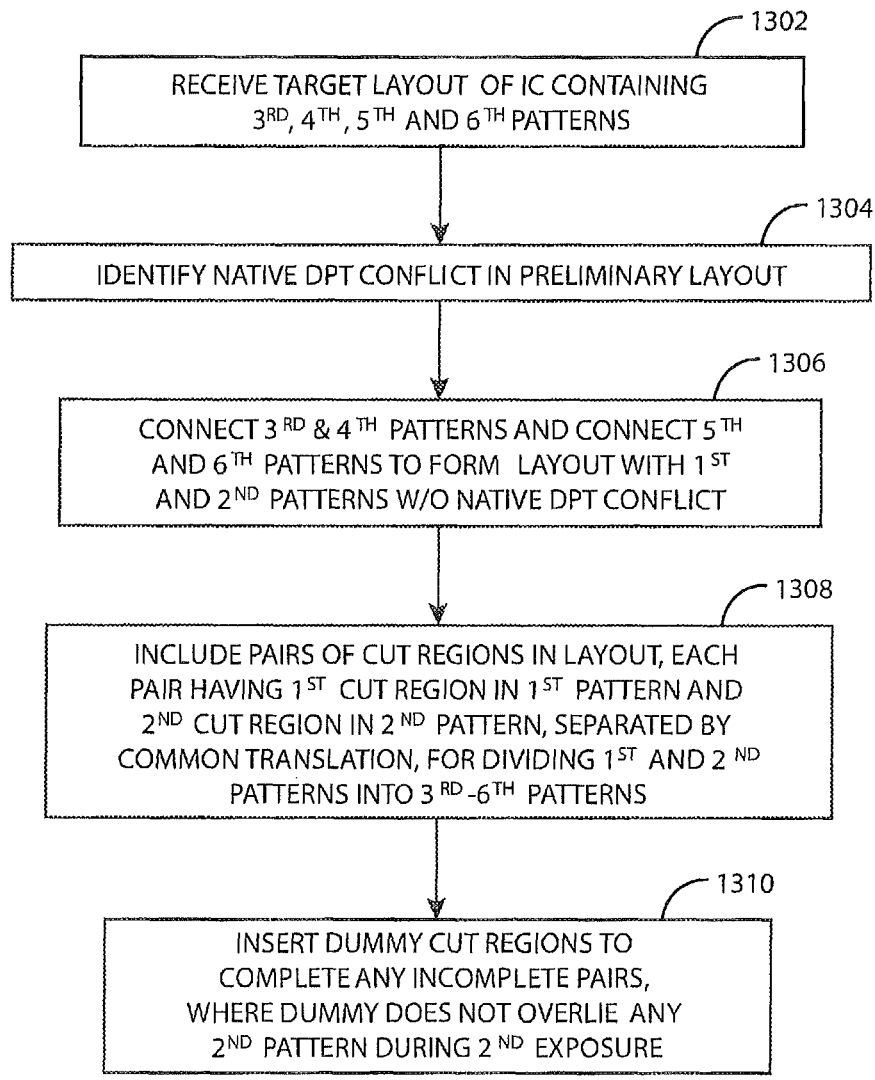
FIG. 13 is a flow chart of a method of providing a layout of a layer of an IC for patterning by the method of FIG. 12.

FIG. 13 is a flow chart of a layout method, for providing layouts of the conductive patterns and cut patterns for an IC layer that is to be fabricated by multiple patterning (e.g., DPT, TPT or other MPT).

At step 1302 a target layout of the layer of the IC substrate containing the third, fourth, fifth and sixth conductive patterns (e.g., 101-104 in FIG. 1A) is received. An example of such a target layout is shown and described above with respect to FIG. 1A, and the description is not repeated for brevity. A distance between the third and fourth conductive patterns is smaller than a minimum separation distance between two patterns formed using a single photomask with a single exposure step.

At step 1304, a native double patterning (or other MPT) conflict in the target layout is identified. When there is a native conflict, the cut process described above can be used to resolve the conflict.

At step 1306, the method generates the layout having the first conductive pattern 151 and the second conductive pattern 152 by connecting the third pattern 101 to the fourth pattern 102, and connecting the fifth pattern 103 to the sixth pattern 104. This eliminates the sub-minimum separation spacings between patterns 101 and 102, and between patterns 103 and 104 from the layout. The joined patterns can be clearly formed on the substrate, and subsequently separated by the metal cut process.

At step 1308 the method lays out pairs of cut regions. Each pair of cut regions has a respective first cut region in a respective first metal pattern and a respective second cut region in a respective second metal pattern, wherein each second cut has a common translation with respect to its corresponding first cut. For example, the cut regions 161 and 162 of FIG. 1B form such a pair of cut regions.

For example, as shown in FIG. 1B, the method generates a layout of a cut mask having a cut pattern to be used in a first cut patterning step while the cut mask is in a first position relative to the substrate to remove material from a first region 161 of the first metal pattern 151 to divide the first metal pattern into a third metal pattern 101 and a fourth metal pattern 102, such that the same cut mask is to be used to be used in a second cut patterning step while the cut mask is in a second position relative to the layer over the substrate to remove material from a second region 162 of the second metal pattern 152 to divide the second metal pattern into a fifth metal pattern 103 and a sixth metal pattern 104.

At step 1310 the method inserts dummy cut regions to complete any incomplete pairs (i.e., for which a cut is made in a first conductive pattern, but no corresponding second conductive pattern exists at a location separated from the first cut region by the common translation). The dummy cut regions differ from the other cut regions in that, when a cut mask is used to remove material, the dummy cut regions do not overlie any conductive material. That is, for some cut region pairs, when the cut mask is in the first position, a cut pattern of the mask overlies a conductive pattern during the first cut exposure step; subsequently, after the cut mask is shifted to the second position, the same cut patterns is positioned so as not to overlie any of the second conductive patterns during the second exposure step.

A respective first cut region is laid out in a further first metal pattern, for which there is no corresponding second metal pattern at a location separated from the first cut region by the common translation. The first (pattern) layout of the pattern mask has a plurality of layout pattern pairs, to which to the respective pairs of cut regions correspond. A dummy cut pattern is inserted in the second (cut mask) layout, at the location separated from the first cut region by the common translation.

The cut mask layout is now suitable for multiple exposures of cut patterns, where one of the group consisting of the cut mask and the substrate is shifted with respect to the other of the group consisting of the cut mask and the substrate between exposures. The cut mask is used to remove material so as to divide the first conductive pattern 151 into a third conductive pattern 101 and a fourth conductive pattern 102, which are unconnected to each other.

Figure 14:
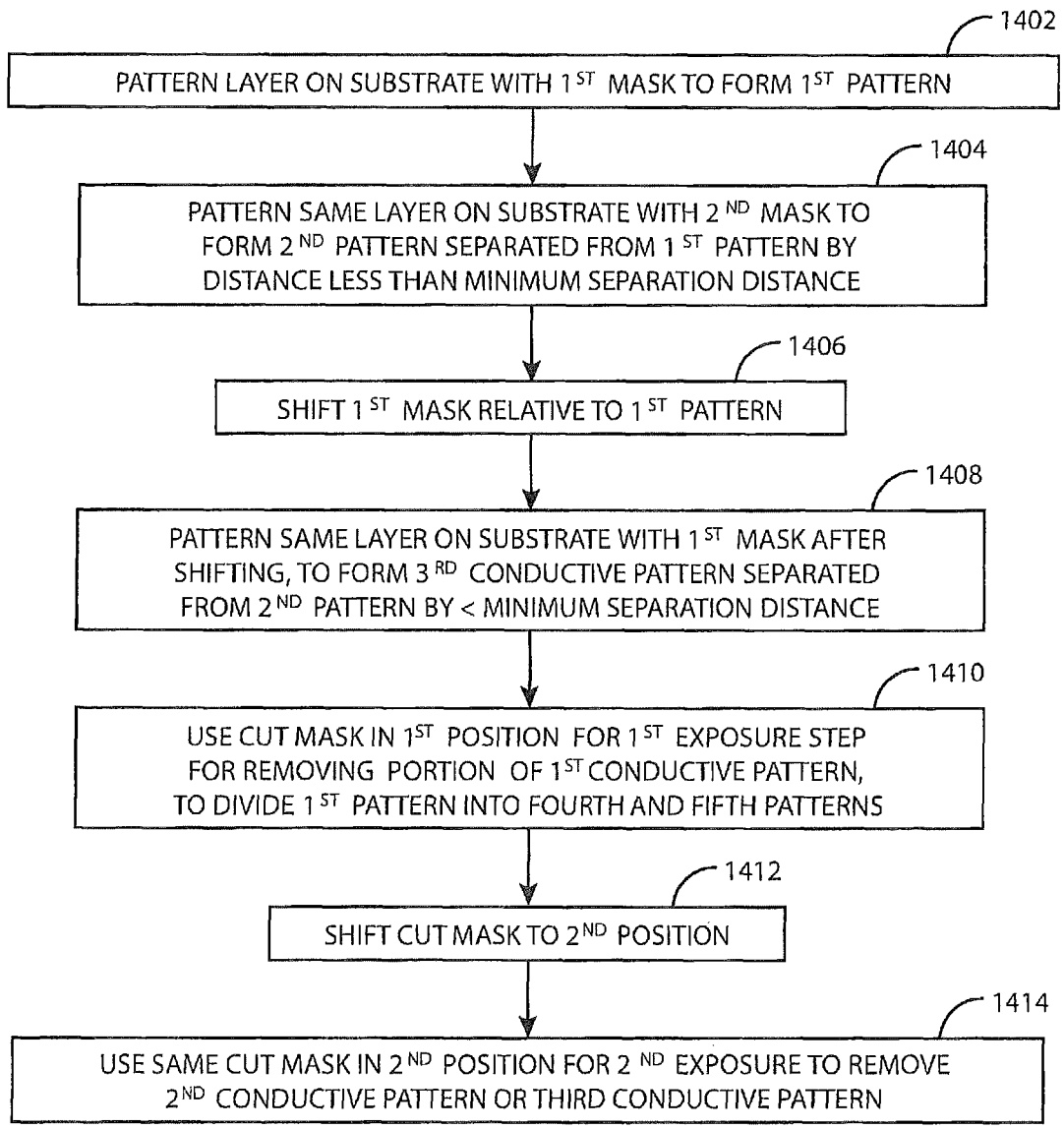
FIG. 14 is a flow chart of a triple patterning method in which at least one of the group consisting of a pattern mask and a cut mask is shifted for multiple exposures within the same layer of the same IC die.

FIG. 14 is a flow chart of a triple patterning technology (TPT) method.

At step 1402, a layer over an integrated circuit (IC) substrate is patterned with a first photomask to form a first conductive pattern.

At step 1404, the same layer over the IC substrate is patterned with a second photomask to form a second conductive pattern separated from the first conductive pattern by a distance less than a minimum separation distance between two patterns formed using a single photomask with a single exposure step.

At step 1406, the first photomask is shifted relative to the first conductive pattern.

At step 1408, the same layer over the IC substrate is patterned with the first photomask after the shifting step to form a third conductive pattern separated from the second conductive pattern by a distance less than the minimum separation distance.

In some embodiments, the method of steps 1402-1408 is used for TPT with two pattern masks, without using any cut masks. For example, if there are no native TPT conflicts, the layout of the layer over the substrate can be triple patterned using two pattern masks and zero cut masks.

In other embodiments, (e.g., where there are native TPT conflicts), an additional cut process is performed. At step 1410 a cut mask is used in a first position for a first exposure step of a cut process for removing a portion of the first conductive pattern to divide the first conductive pattern into fourth and fifth conductive patterns.

At step 1412, the cut mask is shifted to a second position.

At step 1414, the same cut mask is used while the cut mask is in the second position for a second exposure step of a cut process for removing a portion of one of the group consisting of the second conductive pattern and the third conductive pattern.

In some embodiments, the first photomask has a further pattern, and the cut mask has a further cut pattern for removing a portion of the further pattern. A dummy cut pattern can be inserted at a location in the layout of the layer of the IC corresponding to the location of the further cut pattern of the cut mask while the cut mask is in the second position.

Although examples are provided above showing a single cut mask shifted one time to remove material patterned using two photomasks (DPT), in other embodiments, the single cut mask can be shifted two or more times to remove material from conductive patterns formed by three or more photomasks (using TPT, or other MPT method).

Figure 15:
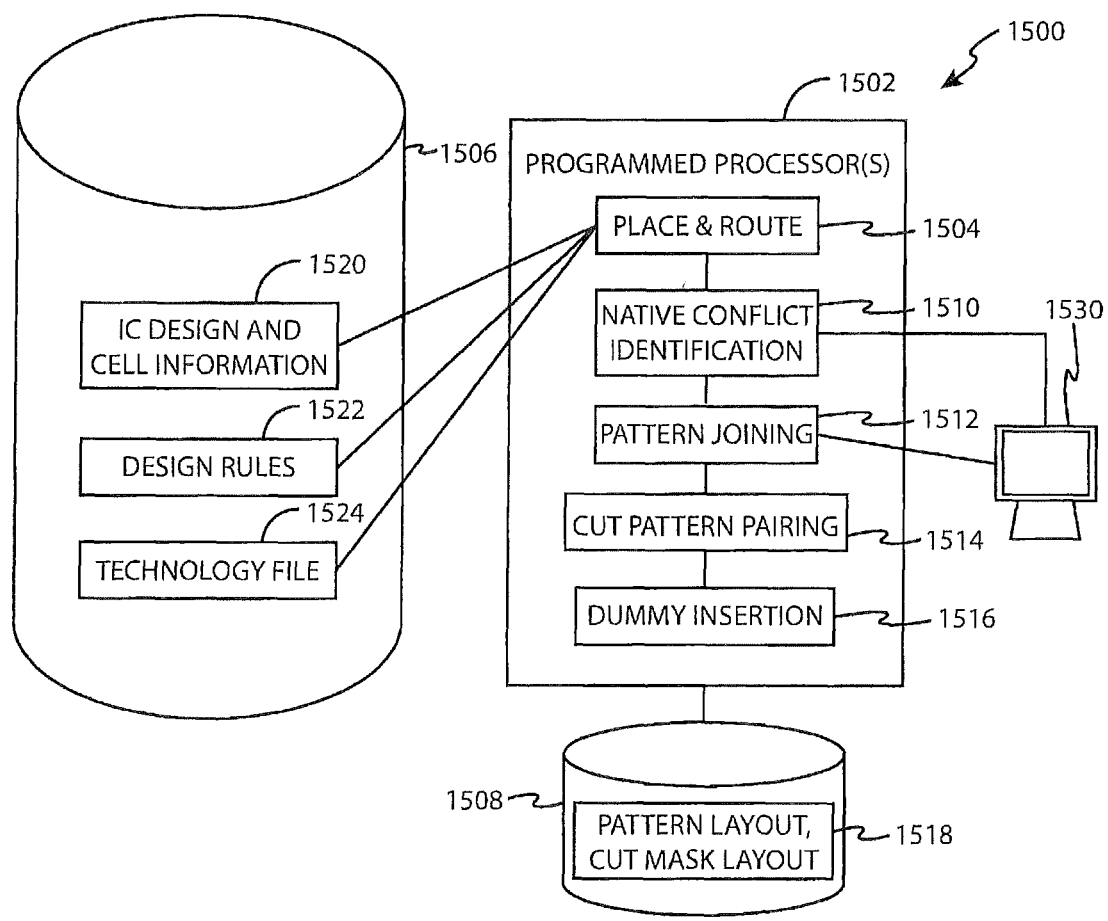
FIG. 15 is a block diagram of a system for performing the methods described below.

FIG. 15 is a block diagram of a system 1500 for providing layouts of the pattern and cut masks for the layer, according to one embodiment. Block 1502 indicates that one or more programmed processors may be included. In some embodiments, the processing load is performed by two or more application programs, each operating on a separate processor. In other embodiments, the processes are all performed using one processor. Similarly, two media 1506 and 1508 are shown, but the data may be stored in any number of media. Although FIG. 15 shows an allocation of the various tasks to specific modules, this is only one example. The various tasks may be assigned to different modules to improve performance, or improve the ease of programming.

System 1500 includes an electronic design automation ("EDA") tool such as "IC COMPILER"™, sold by Synopsys, Inc. of Mountain View, CA, which may include a place and route tool 1504, such as "ZROUTE"™, also sold by Synopsys. Other EDA tools may be used, such as the "VIRTUOSO" custom design platform or the Cadence "ENCOUNTER"® digital IC design platform may be used, along with the "VIRTUOSO" chip assembly router 1504, all sold by Cadence Design Systems, Inc. of San Jose, CA.

The EDA tool is a special purpose computer formed by retrieving stored program instructions from a non-transient computer readable storage medium 1506 and executing the instructions on a general purpose processor 1502. Thus, the instructions configure the logic circuits of the processor 1502 to function as an EDA tool. Examples of non-transient computer readable storage mediums 1506, 1508 include, but are not limited to, hard disk drives (HDD), read only memories ("ROMs"), random access memories ("RAMs"), flash memories, or the like. Tangible, non-transient machine readable storage mediums 1506, 1508 are configured to store data generated by the place and route tool 1504.

The router of the place and route tool 1504 is capable of receiving an identification of a plurality of cells to be included in an integrated circuit ("IC") or interposer layout, including a netlist 1520 containing pairs of cells within the plurality of cells to be connected to each other. Router 1504 may be equipped with a set of default design rules 1522 and tech file 1524.

A module 1510 performs native conflict identification for the target layout. Depending on whether the multipatterning to be used is DPT, TPT or other type of multipatterning, the technique of identifying a native conflict can vary. For example, graphical techniques can be used, and a determination can be made whether a graph of the layout contains odd and/or even loops. In some embodiments, a display 1530 displays a graphical representation of the layout graph, and assists the user in identification of the conflict.

A pattern joining module 1512 determines which patterns of the target layout can be joined prior to photolithography (for subsequent separation by the cut process described above). The module 1512 modifies the layout to join at least one pair of conductive patterns prior to the photolithographic patterning of the conductive line layer.

A cut pattern pairing module 1514 identifies cut patterns corresponding to each of the regions added by the pattern joining module. These patterns are to be formed using the cut (or trim) mask. The cut pattern pairing module identifies existing pairs of patterns, identifies the shift distance and direction (based on the relationships of cut patterns within the existing pairs).

A dummy insertion module 1516 identifies incomplete pairs of cut patterns. For each incomplete pair, the dummy insertion module 1516 determines on which side of the existing dummy pattern to insert a dummy pattern, so that after dummy insertion, all the cut patterns in the cut mask layout include either a pair of cut patterns separated by a common translation, or a pair including a cut pattern and a dummy cut pattern separated by the common translation.

The pattern layout with and the cut mask layout 1518 are then stored in a non-transitory machine-readable storage medium 1508.

In some embodiments, a method comprises patterning a layer over a substrate with a first metal pattern; using a cut mask in a first position relative to the substrate to perform a first cut patterning for removing material from a first region within the first pattern; and using the same cut mask to perform a second cut patterning while in a second position relative to the same layer over the substrate, for removing material from a second region of the same layer over the substrate.

In some embodiments, the step of using the cut mask in the first position divides the first metal pattern into a second metal pattern and a third metal pattern, the second and third metal patterns being unconnected to each other.

In some embodiments, a distance between the second and third metal patterns is smaller than a single-patterning minimum separation distance.

In some embodiments, the patterning step is performed using a first photomask, further comprising, before using the cut mask to perform the second cut patterning, patterning the same layer over the substrate with a second photomask to form a second metal pattern having the second region.

In some embodiments, the cut mask has a first cut pattern and a second cut pattern; and the step of using the cut mask in the first position further comprises removing the material from the first region of the layer over the substrate using the first cut pattern, and removing the material from a third region of the layer over the substrate using the second cut pattern; and the step of using the cut mask in the second position uses the second cut pattern to remove metal material from the layer over the substrate.

Some embodiments further comprise shifting a position of one of the substrate and the cut mask relative to the other of the substrate and the cut mask between the steps of using the cut mask in the first and second positions.

In some embodiments, the shifting includes shifting the cut mask in a vertical direction and a horizontal direction relative to the first position.

In some embodiments, the patterning step is performed using a first pattern mask, and the method further comprises: shifting a position of one of the substrate and the first pattern mask relative to the other of the substrate and the first pattern mask after the patterning step; and patterning the same layer over the substrate with the second metal pattern using the first pattern mask before using the cut mask in the second position.

In some embodiments, the cut mask has a plurality of cut patterns, the first cut patterning step in the first position performs cut patterning for removing material from a plurality of first regions in a first plurality of metal patterns, and patterning step in the second position includes using the same cut mask to perform a second cut patterning for removing material from a plurality of second regions in the first plurality of metal patterns while in the second position relative to the same layer over the substrate.

In some embodiments, a smallest spacing between one of the first regions and one of the second regions is smaller than a spacing between ones of the plurality of cut patterns in the cut mask.

In some embodiments, a method comprises: providing a first layout of a layer over a substrate having a first metal pattern and a second metal pattern, and generating a second layout of a cut mask having a cut pattern to be used in a first cut patterning step while the cut mask is in a first position relative to the substrate to remove material from a first region of the first metal pattern to divide the first metal pattern into a third metal pattern and a fourth metal pattern, such that the same cut mask is to be used in a second cut patterning step while the cut mask is in a second position relative to the layer over the substrate to remove material from a second region of the second metal pattern to divide the second metal pattern into a fifth metal pattern and a sixth metal pattern.

In some embodiments, the first layout of the layer over the substrate has a plurality of first patterns; and the second layout of the cut mask has a plurality of cut patterns, each respective cut pattern to be used during the first cut patterning step for removing material from a respective first region of a respective one of the first metal patterns, to divide the respective first metal pattern into a respective third metal pattern and a respective fourth metal pattern.

In some embodiments, at least one of the cut patterns is positioned so as to perform a dummy cut during the second cut patterning step In some embodiments, the generating step includes: providing a layout of pairs of cut regions, each pair having a respective first cut region in a respective first metal pattern and a respective second cut region in a respective second metal pattern, wherein each second cut has a common translation with respect to its corresponding first cut.

Some embodiments further comprise providing a layout of a respective first cut region in the second layout, corresponding to a further first metal pattern, for which there is no corresponding second metal pattern at a location separated from the first cut region by the common translation; and inserting a dummy cut pattern in the second layout, at the location separated from the first cut region by the common translation.

In some embodiments, the first layout has a plurality of layout pattern pairs, corresponding to the respective pairs of cut regions.

In some embodiments, the first metal pattern is to be formed using a first pattern mask, and the second metal pattern is to be formed by shifting the first pattern mask relative to the first metal pattern to a second location, and patterning the same layer over the substrate while the same first pattern mask is in the second location.

Some embodiments further comprise: receiving a target layout of the layer over the substrate containing the third, fourth, fifth and sixth metal patterns; and generating the first layout having the first metal pattern and the second metal pattern by connecting the third pattern to the fourth pattern, and connecting the fifth pattern to the sixth pattern.

In some embodiments, a triple patterning technology (TPT) method comprises: patterning a layer over an integrated circuit (IC) substrate with a first photomask to form a first metal pattern; patterning the same layer over the substrate with a second photomask to form a second metal pattern; shifting the first photomask relative to the first metal pattern after forming the first metal patter; and patterning the same layer over the substrate with the first photomask after the shifting step to form a third metal pattern.

Some embodiments of the TPT method include using a cut mask in a first position relative to the substrate to perform a first cut patterning for removing material from a first region within the first, second or third pattern; and using the same cut mask to perform a second cut patterning while in a second position relative to the same layer over the substrate, for removing material from a second region within the first, second or third pattern.

In some embodiments, the method performs triple patterning using two patterning masks without using a cut mask.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMS, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
providing a first layout of a first layer over a substrate, the first layer having at least one metal pattern, and
generating a second layout by placing a cut mask at a first position relative to the substrate to remove material from a first region of the at least one metal pattern to provide a first metal pattern and placing the cut mask at a second position relative to the first layer over the substrate to remove material from a second region of the at least one metal pattern to provide a second metal pattern,
wherein the cut mask comprises a plurality of cut patterns, and at least one of the cut patterns is positioned so as to perform a dummy cut during a second cut patterning step.

2. The method of claim 1, wherein:
the first and second metal patterns form at least a portion of the second layout; and
the first metal pattern comprises a plurality of first metal patterns, each of the plurality of first metal patterns having a respective first region.

3. The method of claim 2, wherein each respective cut pattern of the plurality of cut patterns is used during a first cut patterning step for removing material from the respective first region of a respective one of the first metal patterns, to divide a respective first metal pattern into a respective third metal pattern and a respective fourth metal pattern.

4. The method of claim 1, wherein the generating step includes:
providing pairs of cut regions in the second layout, each pair having a respective first cut region in a respective first metal pattern and a respective second cut region in a respective second metal pattern, wherein each second cut has a common translation with respect to a corresponding first cut.

5. The method of claim 4, further comprising
providing a respective first cut region in the second layout, corresponding to a further first metal pattern, for which there is no corresponding second metal pattern at a location separated from the first cut region by the common translation; and
inserting a dummy cut pattern in the second layout, at the location separated from the first cut region by the common translation.

6. The method of claim 4, wherein the first layout has a plurality of layout pattern pairs, corresponding to the respective pairs of cut regions.

7. The method of claim 1, wherein the first metal pattern is formed using a first pattern mask, and the second metal pattern is formed by shifting the first pattern mask relative to the first metal pattern to a second location, and patterning the first layer over the substrate while the same first pattern mask is in the second location.

8. The method of claim 7, further comprising:
receiving a target layout of the layer over the substrate containing third, fourth, fifth and sixth metal patterns; and
generating the first layout having the first metal pattern and the second metal pattern by connecting the third pattern to the fourth pattern, and connecting the fifth pattern to the sixth pattern.

9. A method comprising:
(a) patterning a first layer over an integrated circuit (IC) substrate with a first photomask to form a first metal pattern;
(b) patterning the first layer over the IC substrate with a second photomask to form a second metal pattern;
(c) shifting the first photomask relative to the first metal pattern after step (a); and
(d) patterning the first layer over the IC substrate with the first photomask after the shifting step to form a third metal pattern, wherein each of the first, second and third metal patterns comprises a plurality of metal lines.

10. The method of claim 9, further comprising placing a cut mask at a first position relative to the IC substrate to remove material from a first region of the first metal pattern to provide a third metal pattern and placing the cut mask at a second position relative to the first layer over the IC substrate to remove material from a second region of the second metal pattern to provide a fourth metal pattern.

11. The method of claim 10, wherein the first metal pattern includes a first line, a second line, and a third line, and the second metal pattern includes a fourth line and a fifth line, wherein the fourth line is between the first line and the second line, and the third line is between the second line and the fifth line.

12. The method of claim 11, wherein the third metal pattern includes a sixth line, a seventh line and an eighth line, wherein the sixth line is between the second line and the third line, and the seventh line is between the third line and the fifth line.

13. The method of claim 9, wherein the first metal pattern includes first, second and third lines, and the third metal pattern includes fourth, fifth and sixth lines, and the fourth line is between the second line and the third line.

14. The method of claim 9, further comprising using a cut mask to remove material from the first line and the second line, so as to divide each of the first and second lines into two segments.

15. The method of claim 14 further comprising moving the cut mask and using the cut mask to remove material from the third line and fourth line, so as to divide each of the third and fourth lines into two segments.

16. The method of claim 9, wherein a cut mask is not used, and wherein the first metal pattern includes at least a first line and a second line, and the second metal pattern includes at least a third line and a fourth line, such that after step (b), the third line of the second metal pattern is between the first line and the second line of the first metal pattern.

17. A method comprising
(a) patterning a first layer over a substrate with a first metal pattern using a first photomask;
(b) using a first trim mask to perform a first cut patterning while the first trim mask is in a first position relative to the first layer for removing material from a first region within the first metal pattern;
(c) patterning the first layer over the substrate with a second photomask in a double patterning process to form a second metal pattern having a second region; and
(d) using the first trim mask to perform a second cut patterning while the first trim mask is in a second position relative to the first layer for removing material from the second region of the second metal pattern of the first layer over the substrate, wherein each of the first and second metal patterns comprises a plurality of metal lines.

18. The method of claim 17, wherein step (a) is performed using a first photomask, further comprising, before step (c), patterning the first layer over the substrate with a second photomask to form the second metal pattern.

19. The method of claim 18, wherein a distance between the first and second metal patterns is smaller than a single-patterning minimum separation distance.

20. The method of claim 17, wherein step (a) is performed using a first pattern mask, the method further comprising:
shifting a position of one of the substrate and the first pattern mask relative to the other of the substrate and the first pattern mask after step (a); and patterning the same layer over the substrate with the second metal pattern using the first pattern mask before step (c).

* * * * *